United States Patent [19]

Nagashima

[11] Patent Number: 4,748,630
[45] Date of Patent: May 31, 1988

[54] OPTICAL MEMORY DEVICE COMPRISING A SEMICONDUCTOR LASER HAVING BISTABILITY AND TWO INJECTION CURRENT SOURCES FOR INDIVIDUALLY CONTROLLING THE BISTABILITY

[75] Inventor: Kunio Nagashima, Tokyo, Japan

[73] Assignee: NEC Corporation, Tokyo, Japan

[21] Appl. No.: 818,932

[22] Filed: Jan. 15, 1986

[30] Foreign Application Priority Data

Jan. 17, 1985 [JP] Japan .................................. 60-6087
Jun. 28, 1985 [JP] Japan ................................ 60-142269

[51] Int. Cl.⁴ ............................................. H01S 3/19
[52] U.S. Cl. ........................................ 372/8; 372/50
[58] Field of Search ................................ 372/8, 44, 50

[56] References Cited

U.S. PATENT DOCUMENTS 3,427,563  2/1969  Lasher .................................. 372/8
3,525,024  8/1970  Kawaji .................................. 372/8

Primary Examiner—James W. Davie
Attorney, Agent, or Firm—Sughrue, Mion, Zinn, Macpeak and Seas

[57] ABSTRACT

In an optical memory device comprising a bistable semiconductor laser having two coplanar electrodes (26, 27) injection current sources (31, 32) for the respective electrodes are individually adjusted to make the laser selectively latch first and second optical input signals (P1, P2). It is possible to provide an optical master-slave flip-flop device by optically directly coupling two optical memory devices of the type described to each other in tandem. Furthermore, an optical signal shifting device can be provided by arranging, optically in tandem, a plurality of optical master-slave flip-flop devices of the type described.

13 Claims, 12 Drawing Sheets (A)          (B)

OPTICAL MEMORY DEVICE COMPRISING A SEMICONDUCTOR LASER HAVING BISTABILITY AND TWO INJECTION CURRENT SOURCES FOR INDIVIDUALLY CONTROLLING THE BISTABILITY

BACKGROUND OF THE INVENTION

This invention relates to an optical memory device comprising a bistable semiconductor laser. The optical memory device is not only useful as an optical memory element but also in an optical master-slave flip-flop device and in an optical signal shifting device or optical shift register. The optical memory elements, the optical master-slave flip-flop device, and the optical signal shifting device are useful in an optical digital computer.

A semiconductor laser having a bistability, is revealed in a letter contributed by H. Kawaguchi to Electronics Letters, Vol. 17, No. 20 (Oct. 1, 1981), pages 741 and 742, under the title of "Bistable Operation of Semiconductor Lasers by Optical Injection." It is possible to manufacture an optical memory device by using the bistable semiconductor laser in the manner which will later be described a little more in detail. The optical memory device is, however, not satisfactorily operable when two optical input signals are simultaneously supplied thereto.

An improved bistable semiconductor laser is disclosed and used in an optical memory device in a report which is read by Y. Odagiri and K. Komtsu at Conference on Lasers and Electro-optics held June 19–22, 1984, and is printed in Technical Digest of the conference, pages 184 through 186, under the title of "Bistable Laser-diode Memory for Optical Time-division Switching Applications" (Report No. THJ3). The Odagiri et al report, however, does not teach selective memory of two optical input signals which are concurrently supplied to the optical memory device.

It is possible by using a pair of optical memory devices, each comprising the improved bistable semiconductor laser, to manufacture an optical master-slave flip-flop device. The flip-flop device must, however, comprise an optical isolator between the optical memory pair as will later be pointed out more in detail. The optical isolator complicates the circuitry and renders it difficult to implement the flip-flop device as an integrated circuit.

To speak of electrical signals, logic operation is carried out at a high speed by a high-speed logic operation device which may comprise Josephson junction devices. Optical signals are often used in representing two-dimensional digital information of a large quantity. Conversion of the optical signals to electrical signals on carrying out logic operation, is objectionable in view of the speed of operation and the power consumption. It is therefore disirable to provide a satisfactorily operable optical memory device in order to carry out the logic operation directly on the optical signals.

SUMMARY OF THE INVENTION

It is therefore an object of the present invention to provide an optical memory device which comprises a semiconductor laser having a bistability and two injection current sources capable of individually controlling the bistability.

It is another object of this invention to provide an optical memory device of the type described, which is operable as a bidirectional optical memory device capable of selectively memorizing two optical input signals simultaneously supplied thereto.

It is a further object of this invention to provide an optical master-slave flip-flop device which comprises a pair of optical memory devices of the type described and need not comprise an optical isolator between the optical memory pair.

It is a still further object of this invention to provide an optical master-slave flip-flop device of the type described, which is simple in structure and is readily implemented as an integrated circuit.

It is an additional object of this invention to provide an optical signal shifting device which comprises a plurality of the optical master-slave flip-flop devices of the type described.

Other objects of this invention will become clear as the description proceeds.

According to this invention, there is provided an optical memory device which includes a bistable semiconductor laser comprising an active layer and first and second electrodes separately parallel to the active layer and is characterized by comprising first and second adjustable current sources for supplying first and second injection currents to the active layer through the first and the second electrodes, respectively.

According to this invention, there is also provided an optical master-slave flip-flop device which includes first and second bistable semiconductor lasers optically in tandem. each laser comprising an active layer and first and second electrodes separately parallel to the active layer, and which is characterised by comprising first and second current sources for supplying first and second injection currents to the active layer of each of the first and the second bistable semiconductor lasers through the first and the second electrodes thereof, respectively.

According to this invention, there is furthermore provided an optical signal shifting device including first through N-th bistable semiconductor lasers optically in tandem where N represents an even positive integer which is not less than two. Each bistable semiconductor laser comprises an active layer and first and second electrodes separately parallel to the active layer. The active layer has first and second ends adjacent to the first and the second electrodes, respectively. The (n−1)-th and the n-th bistable semiconductor lasers are arranged optically in tandem with the second end of the active layer of the (n−1)-th bistable semiconductor laser coupled optically directly to the first end of the active layer of the n-th bistable semiconductor laser where n represents each of 2 through N. The optical signal shifting device is characterized by comprising first and second current sources for supplying first and second injection currents to the active layer of each of the first through the N-th bistable semiconductor lasers through the first and the second electrodes thereof, respectively, a first electrical terminal connected to the first current sources for the odd-numbered bistable semiconductor lasers, and a second electrical terminal connected to the first current sources for the even-numbered bistable semiconductor lasers.

DESCRIPTION OF THE PREFERRED EMBODIMENTS

Figure 1:
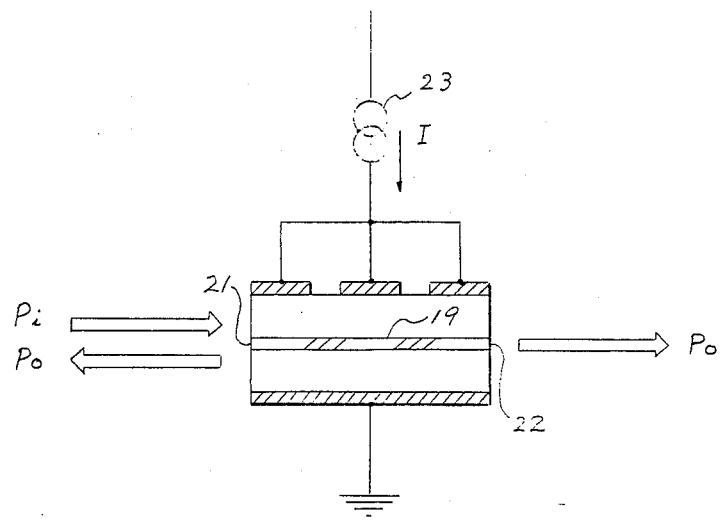
FIG. 1 shows a conventional optical memory device with a conventional bistable semiconductor laser of the device depicted schematically in vertical section.

Referring to FIG. 1, a bistable semiconductor laser or bistable laser diode of the above-referenced Kawaguchi letter will briefly be described at first in order to facilitate an understanding of the present invention. The laser is of a structure which is not much different in outline from a semiconductor laser of the current injection type and may be a GaAlAs/GaAs or InGaAsP/InP double heterojunction laser. If necessary, reference should be had as regards such a double heterojunction laser to U.S. Pat. No. 4,105,955 issued to Izuo Hayashi and Roy Long and assigned to the instant assignee.

The laser comprises an active layer 19 which is referred to in the Hayashi et al patent as a strip region. The active layer 19 has first and second ends 21 and 22 and is generally parallel to a pair of electrodes of the laser. Like in a usual semiconductor laser, laser oscillation takes place in the active layer 19 when an injection current I is injected to the active layer 19 through the electrodes. Restricted by the first and the second ends 21 and 22, the active layer 19 serves as a resonator for the laser oscillation. The bistable semiconductor laser therefore has a resonator axis through the active layer 19. The laser is depicted in vertical section taken along a plane which includes the resonator axis.

In contrast to an active layer of a usual semiconductor laser, the active layer 19 comprises two gain sections and a loss section along the resonator axis. The loss section is indicated in the figure with hatches between the two gain sections. In the example being illustrated, the active layer 19 consists of three gain sections and two loss sections. Each loss section is not supplied with the injection current I and serves as a saturation absorber of the laser oscillation. The loss section or sections are formed either by giving an inhomogeneity to the active layer 19 or by dividing one of the electrodes into parts in the manner clearly depicted in the figure. The other electrode need not be divided and may be a single counterelectrode.

A current source for the injection current I is shown at 23. The current source 23 is an adjustable constant-current current source. The counterelectrode is grounded.

In the manner which will shortly be described, a combination of the bistable semiconductor laser and the adjustable current source 23 serves as an optical memory device for use in memorizing an optical input signal Pi supplied to either of the first and the second ends 21 and 22. It is to be noted in connection with such a conventional optical memory device that the optical input signal Pi should be supplied to only one of the first and the second ends 21 and 22. The optical memory device produces an optical output signal Po from each of the first and the second ends 21 and 22. It may be mentioned here that two optical signals related to one end of the active layer 19, such as the optical input and output signals Pi and Po, are depicted offset in the accompanying figures for clarity of illustration.

Figure 2:
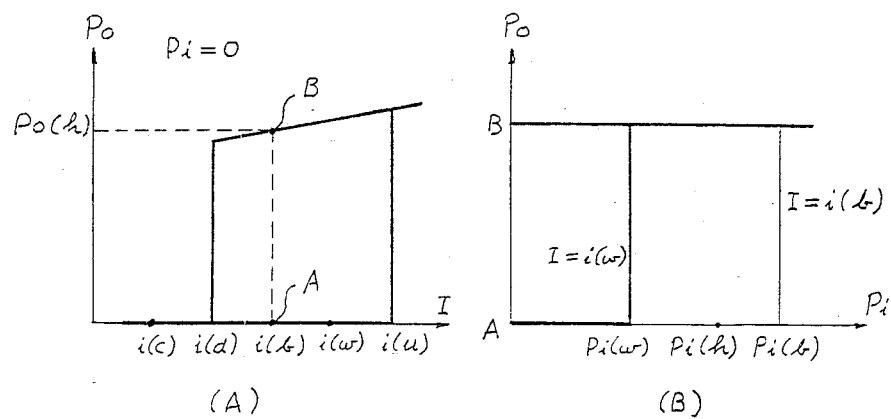
FIGS. 2 (A) and 2 (B) show bistabilities of the laser used in the device illustrated in FIG. 1.

Turning to FIG. 2 (A), it will be assumed at first that the optical input signal Pi is supplied to neither of the first and the second ends 21 and 22. In other words, the optical input signal Pi has an optical intensity or power of a low level of zero. The optical output signal Po has an intensity which suddenly or steeply grows when the injection current I is increased to an upper threshold value herein designated by i(u) for clarity of print. The optical output signal Po slowly increases when the injection current I is further increased.

When the injection current I is decreased from a value above the upper threshold value i(u), the intensity of the optical output signal Po suddenly falls when the injection current I is decreased to a lower or down threshold value i(d). In general, the upper threshold value i(u) is three or four milliamperes greater than the lower threshold value i(d).

The bistable semiconductor laser has in this manner an optical output versus injection current characteristic which has a hysteresis loop schematically depicted by thick lines. The laser has low and high stable states A and B when the injection current I is used as a bias current of a bias value i(b) which is selected between the lower and the upper threshold values i(d) and i(u). At the bias value i(b) of the injection current I, the optical output signal Po has either a low intensity of zero or a high intensity Po(h) depending on previous values from which the injection current I is changed to the bias value i(b). This is also the case when the injection current I is given a write value i(w) which is higher than the bias value i(b) and may be a function of milliampere less than the upper threshold value i(u). When the injection current I is given a clear value i(c) which is lower than the lower threshold value i(d), the laser has only one state at which the optical output signal Po has the low intensity of zero.

Further turning to FIG. 2 (B), it will now be assumed that the injection current I is given the write value i(w). The bistable semiconductor laser is in either of the low and the high stable states which will be denoted by A and B like the stable states for the injection current I of the bias value i(b). If the laser is in the low stable state A, the optical output signal Po suddenly grows to the high intensity Po(h) from the low intensity of zero when the intensity of the optical input signal Pi is increased from the low level of zero to a write level Pi(w) in the manner indicated by a vertical thick line which is drawn near the middle of the figure and is labelled $I=i(w)$. In other words, the optical input signal Pi of the write level Pi(w) switches the laser under the circumstances from the low stable state A to the high stable state B.

The optical output signal Po is kept substantially at the high intensity Po(h) when the intensity of the optical input signal Pi is further increased. If the optical input signal Pi is given a high level Pi(h) which is above the write level Pi(w), the optical output signal Po has the high intensity Po(h). Even when the optical input signal Pi is weakened from the high level Pi(h) to the low level of zero, the bistable semiconductor laser is kept substantially at the high stable state B. In the manner described in conjunction with FIG. 2 (A), the high stable state B is switched to the low stable state A when the injection current I is given the clear value i(c). The laser has an optical output versus input characteristic which again shows hysteresis.

In FIG. 2 (B), let the injection current I be given the bias value i(b). If the bistable semiconductor laser is in the lower stable state A, the optical signal Po suddenly grows to the high intensity Po(h) when the intensity of the optical input signal Pi is increased to a bias level Pi(b) as shown by a vertical thin line which is drawn near the right end of the figure and labelled $I=i(b)$. The bias level Pi(b) of the optical input signal Pi is higher than the write level Pi(w). It is therefore impossible to set the laser to the high stable state B under the circumstances by the optical input signal Pi of the high level Pi(h) which is lower than the bias level Pi(b).

Figure 3:
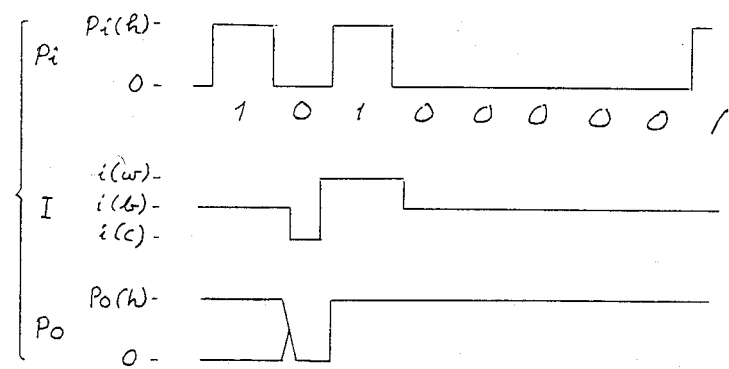
FIG. 3 is a schematic time chart for use in describing operation of the device shown in FIG. 1.

Referring to FIG. 3, let the intensity of the optical input signal Pi be varied between the low level of zero and the high level Pi(h) as exemplified along a first or top line. It is possible to understand in the manner labelled below the first line that the low level represents a logic zero value 0 and the high level Pi(h), a logic one value 1. When the injection current I is varied as exemplified along a second or middle line, the intensity of the optical output signal Po varies in the manner schematically depicted along a third or bottom line.

More particularly referring to FIG. 3, the optical output signal Po keeps either the low intensity of zero or the high intensity Po(h) irrespective of the optical input signal Pi so long as the injection current I is kept at the bias value i(b). When the injection current I is decreased to the clear value i(c), the optical output signal Po is given the low intensity of zero. In other words, the bistable semiconductor laser is reset to the low stable state A no matter in whichever of the low and the high stable states A and B the laser was kept prior to the decrease of the injection current I to the clear value i(c). It should be noted that the reset from the high intensity Po(h) is indicated by a steeply falling line rather than a vertical line merely for convenience of illustration. The fact that the laser is kept in the reset state, namely, in the low stable state A, irrespective of a change in the injection current I from the bias value i(b) to the clear value i(c), is indicated by steeply rising and then falling lines.

When the injection current I is increased to the write value i(w), the optical input signal Pi of the high level Pi(h) is set in the bistable semiconductor laser. The optical output signal Po rises to the high intensity Po(h). The laser is kept at the high stable state B unless the injection current I is given the clear value i(c). In this manner, the optical input signal Pi is latched in the optical memory device by controlling the injection current I in a timed relation to the optical input signal Pi.

Figure 4:
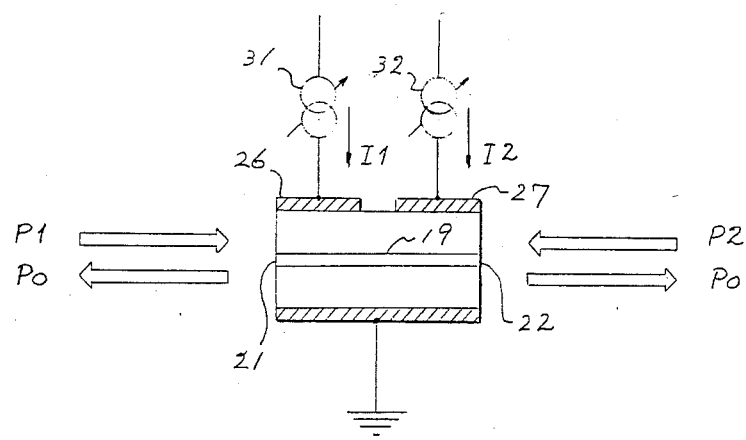
FIG. 4 shows an optical memory device according to a first embodiment of the instant invention, with an improved bistable semiconductor laser of the device depicted schematically in vertical section.

Referring now to FIG. 4, description will proceed to an optical memory device according to a first embodiment of this invention. The device comprises a bistable semiconductor laser which comprises similar parts designated by like reference numerals and is different from the laser described in connection with FIG. 1 in that one of the electrodes should always be separated or divided into first and second electrodes 26 and 27 with the counterelectrode left integral as before. In other words, the laser comprises first and second electrodes 26 and 27 separately parallel to the active layer 19. The first and the second electrodes 26 and 27 are coplanar in principle. It is possible to understand that the first and the second electrodes 26 and 27 are adjacent to the first and the second ends 21 and 22, respectively, and vice versa.

In marked contrast to the conventional optical memory device illustrated with reference to FIGS. 1 through 3, the device of FIG. 4 comprises first and second current sources 31 and 32 like in the above-cited Odagiri et al report. The first and the second current sources 31 and 32 are adjustable to supply first and second injection currents I1 and I2 to the active layer 19 through the first and the second electrodes 26 and 27, respectively. The loss section thereby appears in the active layer 19 although not positively indicated in FIG. 4.

First and second optical input signals P1 and P2 are supplied to the first and the second ends 21 and 22, respectively. The optical output signal Po is emitted from each of the first and the second ends 21 and 22 as above. The laser of FIG. 4 has a bistability as will be understood from the description given above the reference to FIGS. 1 through 3. It should be noted that the first and the second current sources 31 and 32 serve as two injection current sources for use in individually controlling the bistability in the manner which will become clear as the description proceeds.

Referring again to FIGS. 2 (A) and 2 (B), attention will be directed at first to the fact that it is possible to give the bistable semiconductor laser similar optical output versus first and second injection current characteristics and similar optical output versus first and second optical input characteristics to the afore-described gain sections which are provided by the first and the second electrodes 26 and 27. It will therefore be understood merely for brevity of description that the first and the second injection currents I1 and I2 have the lower end the upper threshold values i(d) and i(u) in common. The clear value i(c), the bias value i(b), and the write value i(w) will be selected in common to the first and the second injection currents I1 and I2. The low levels of the first and the second optical input signals P1 and P2 and the low intensity of the optical output signal Po are equal to zero and are common to the first and the second injection currents I1 and I2. For the common bias and write values i(b) and i(2), the bias and the write levels Pi(b) and Pi(w) are understood to be common to the first and the second optical input signals P1 and P2 and also to the first and the second injection currents I1 and I2. The high level Pi(h) will be used in common to the first and the second optical input signals P1 and P2.

Figure 5:
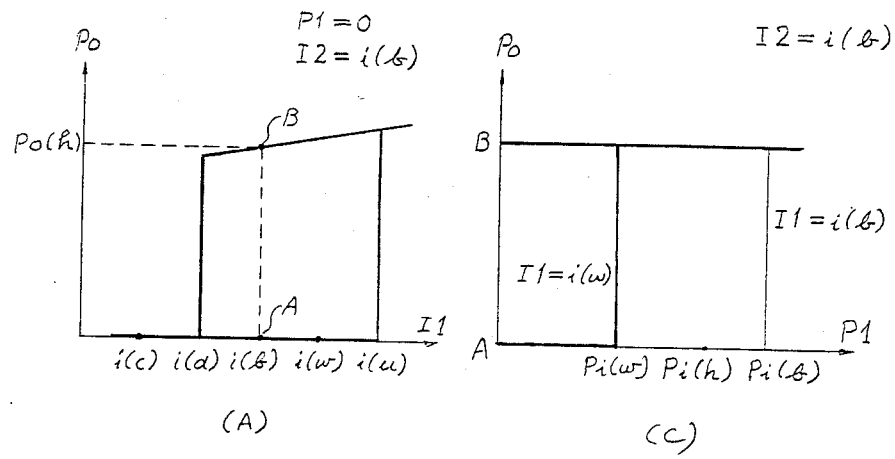
FIGS. 5 (A) through 5 (D) show bistabilities of the laser used in the device illustrated in FIG. 4.
Figure 5:
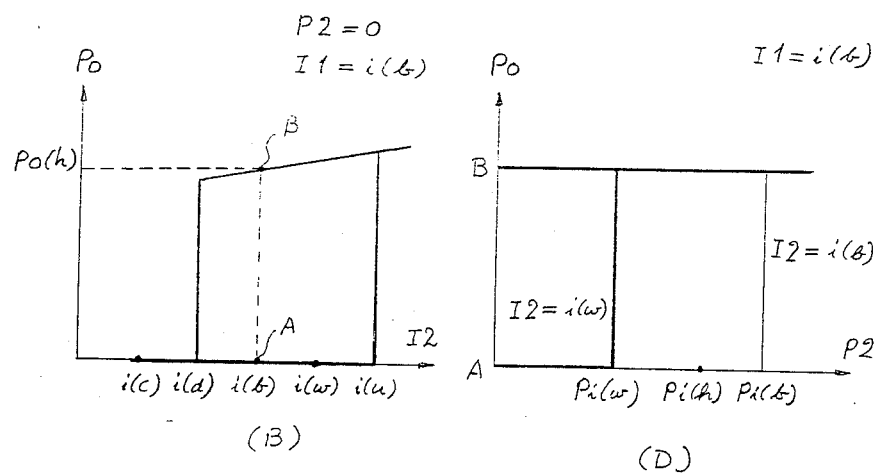

Turning to FIGS. 5 (A) through 5 (D), the bistable semiconductor laser of FIG. 4 has an optical output versus first injection current characteristic which is depicted in FIG. 5 (A) and is similar to the characteristic illustrated with reference to FIG. 2 (A) when the first optical input signal P1 has the low level of zero and furthermore when the second injection current I2 is given the bias value i(b). A like characteristic is obtained between the optical output signal Po and the second injection current I2 in the manner depicted in FIG. 5 (B) when the second optical input signal P2 has the low level with the first injection current I1 set at the bias value i(b). The laser has an optical output versus first optical input characteristic which is shown in FIG. 5 (C) and is similar to the characteristic described in connection with FIG. 2 (B) when the second injection current I2 has the bias value i(b). A similar characteristic results as depicted in FIG. 5 (D) between the optical output signal Po and the second optical input signal P2 when the bias value i(b) is given to the first injection current I1.

Figure 6:
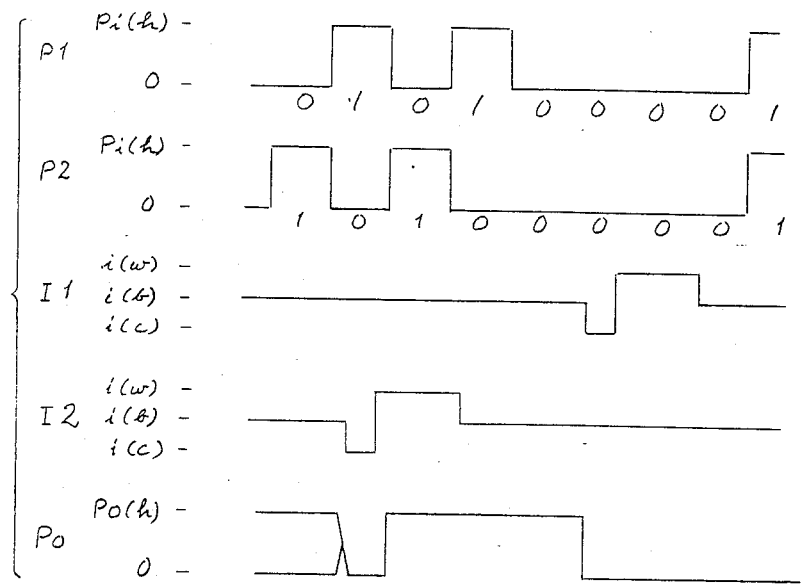
FIG. 6 is a schematic time chart for use in describing operation of the device shown in FIG. 4.

Referring to FIG. 6, it will be assumed that the first and the second optical input signals P1 and P2 are varied between the low level of zero and the high level Pi(h) in the manner depicted along a first or top line and a second line from the top, respectively, together with the logic zero and one values 0 and 1 represented by the first and the second optical input signals P1 and P2. When the first and the second injection currents I1 and I2 are varied independently in a timed relation or in synchronism as exemplified along third and fourth lines from the top, the intensity of the optical output signal Po varies in the manner illustrated along a fifth or bottom line. It will presently be understood that the optical memory device of FIG. 4 is capable of selectively memorizing the first and the second optical input signals P1 and P2.

More specifically referring to FIG. 6, the optical output signal Po has either the low intensity of zero or the high intensity Po(h) irrespective of the first and the second optical input signals P1 and P2 insofar as the first and the second injection currents I1 and I2 are kept at the bias value i(b). In the manner which will soon be understood, the intensity of the optical output signal Po depends on one of the first and the second optical input signal P1 and P2 that was memorized in the device before the bias value i(b) is given to the first and the second injection currents I1 and I2. When either or both of the first and the second injection currents I1 and I2 is given the clear value i(c), the laser of FIG. 4 is reset to the low stable state A of generating the optical output signal Po of the low intensity of zero if the laser was in the high stable state B previous to the decrease of the injection current or currents to the clear value i(c). The laser is left at the low stable state A if the laser was previously kept in the low stable state A.

It will be surmised that the second injection current I2 is decreased at first to the clear value i(c). The optical output signal Po either falls to the low intensity of zero or is kept at the low intensity. When the second injection current I2 is thereafter increased to the write value i(w), the second optical input signal P2 is memorized in the device. The optical output signal Po keeps the low intensity while the second optical input signal P2 has the low level of zero. The optical output signal Po rises to the high intensity Po(h) when the second optical input signal; P2 rises to the high level Pi(h).

In this manner, the bistable semiconductor laser of FIG. 4 is set by the second optical input signal P2 of the high level Pi(h). The optical input signal Po keeps the high intensity Po(h) until the clear value i(c) is given to either or both of the first and the second injection currents I1 and I2. As long as the first and the second injection currents I1 and I2 are kept at the bias value i(b), the intensity of the optical output signal Po is not varied by whichever of the first and the second optical input signals P1 and P2. If the first injection current I1 is reduced to the clear value i(c) and then raised to the write value i(w), the device memorizes the first optical input signal P1.

Figure 7:
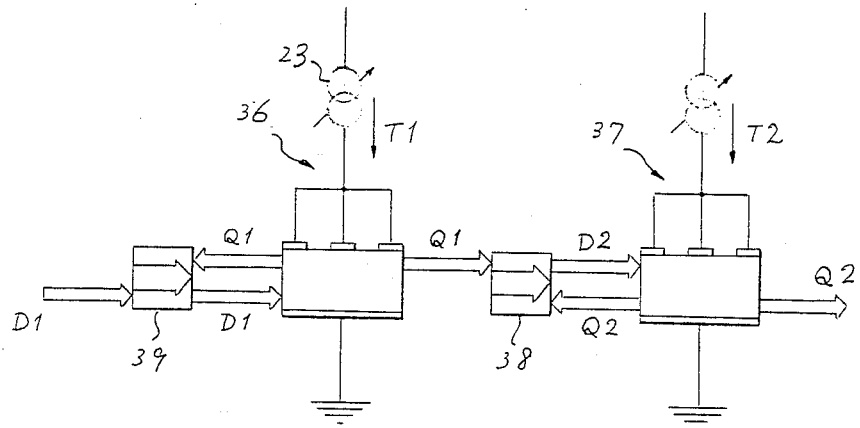
FIG. 7 is a schematic side view of a conventional optical master-slave flip-flop device.

Turning now to FIG. 7, a conventional optical master-sleeve flip-flop circuit or device will be described for a better understanding of an optical master-slave flip-flop device according to this invention. The conventional circuit comprises first and second optical memories 36 an 37, each of which is the conventional optical memory device illustrated with reference to FIGS. 1 through 3. Elements of the first and the second optical memories 36 and 37 will be referred to by the reference numerals used in FIG. 1. It will be assumed that the bistable semiconductor lasers of the respective optical memories 36 and 37 have a common optical output versus injection current characteristic and a common optical output versus input characteristic. The injection currents supplied from the adjustable current source 23 of the first and the second optical memories 36 and 37 will be called first and second injection currents and designated by T1 and T2 for distinction from the first and the second injection currents I1 and I2 described above in conjunction with FIGS. 4 through 6.

The active layers 19 of the respective bistable semiconductor lasers of the first and the second optical memories 36 and 37 are arranged colinear with an intermediate optical isolator 38 interposed. The first optical memory 36 is supplied with a first optical input signal D1 from outside of the circuit through an input optical isolator 39 and generates a first optical output signal Q1 from each of the first and the second ends 21 and 22 of the active layer 19. In the manner which will presently be described, the first optical output signal Q1 is controlled by the first injection current T1 and depends on the first optical input signal D1. The first optical output signal Q1 is delivered from the second end 22 to the second optical memory 37 through the intermediate optical isolator 38 as a second optical input signal D2.

It will be assumed throughout the following that the high intensity Po(h) of an optical output signal, such as the first optical output signal Q1, is not weaker than the high level Pi(h) of an optical input signal. Controlled by the second injection current T2, a second optical output signal Q2 is emitted from each of the first and the second ends 21 and 22 of the active layer 19 of the laser of the second optical memory 42. The intermediate optical isolator 38 is for preventing the second optical output signal Q2 from reaching the first optical memory 36 from the last-mentioned first end 21. Such an optical isolator 38 or 39 is known in the art and is therefore symbolically depicted in the figure.

Figure 8:
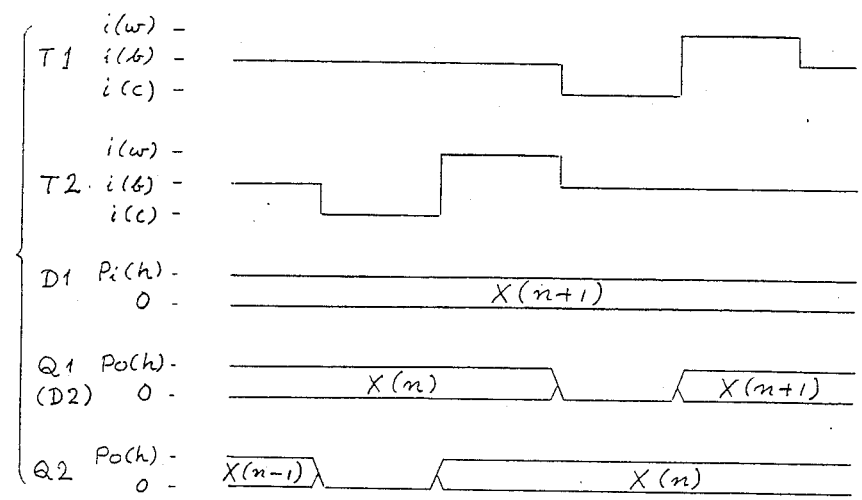
FIG. 8 is a schematic time chart for use in describing operation of the device illustrated in FIG. 7.

Further turning to FIG. 8, the first and the second injection currents T1 and T2 will be varied in the manner exemplified along a first or top line and a second line from the top. The first optical input signal D1 varies between the low level of zero and the high level Pi(h) to successively represent (n−1)-th, n-th, and (n+1)-th optical information X(n−1), X(n), and X(n+1), each of which is either of the logic zero and one values. During a time interval to which attention is directed in connection with the figure, the first optical input signal D1 represents the (n+1)-th optical information as depicted along a third line from the top. At the beginning of the time interval under consideration, it will be assumed that the first optical output signal Q1 or the second optical input signal D2 and the second optical output signal Q2 represent the n-th and the (n−1)-th optical information in the manner illustrated along a fourth or penultimate and a fifth or bottom line. In the optical output signals Q1 and Q2, the optical information X(n−1), X(n), and X(n+1) is represented by either of the low intensity of zero and the high intensity Po(h) in correspondence to the first optical input signal D1.

More particularly in FIG. 8, the first and the second optical memories 36 and 37 (FIG. 7) keep at first the n-th and the (n−1)-th optical information with the bias value i(b) given to the first and the second injectio currents T1 and T2. When the second injection current T2 is reduced to the clear value i(c), the second optical output signal Q2 is given the low intensity of zero no matter whichever of the low intensity and the high intensity Po(h) is used in representing the (n−1)-th optical information. When the second injection current T2 is thereafter increased to the write value i(w), the first optical output signal Q1 or the second optical input signal D2 is memorized in the second optical memory 37. The second optical output signal Q2 represents the n-th optical information so long as the second injection current T2 is not again given the clear value i(c) and unless the second optical input signal D2 is changed to represent different optical information while the second injection current T2 is given the write value i(w).

When the clear value i(c) is given to the first injection current I1, the first optical output signal Q1 is given the low intensity of zero. When the write value i(w) is thereafter given to the first injection current T1, the first optical input signal D1 is memorized in the first optical memory 36. The first and the second optical output signals Q1 and Q2 now represent the (n+1)-th and the n-th optical information.

Reviewing FIGS. 7 and 8, the second optical output signal Q2 would be supplied to the first optical memory 36 as an additional optical input signal if the intermediate optical isolator 48 were not used. In this event, AND of the optical information represented by the first optical input signal D1 and by the additional optical input signal is memorized in the first optical memory 36 when the write value i(w) is given to the first injection current T1. The intermediate optical isolator 38 is therefore indispensable. This complicates the circuitry and makes it difficult to implement the conventional optical master-slave flip-flop circuit as an integrated circuit.

Figure 9:
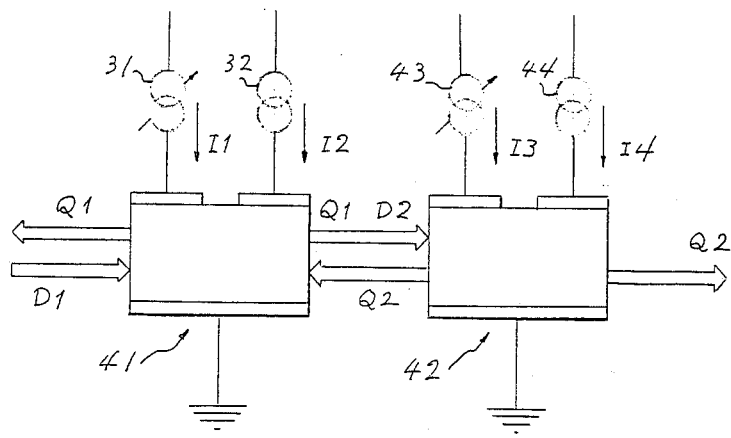
FIG. 9 is a schematic side view of an optical master-slave flip-flop device which comprises a pair of optical memory devices according to a second embodiment of this invention.

Referring now to FIG. 9, description will be given as regards an optical master-slave flip-flop circuit or device which is a combination of a pair of optical memories like the conventional optical master-slave flip-flop circuit and is a second embodiment of this invention. The circuit comprises first and second optical memories 41 and 42, each of which is the optical memory device illustrated with reference to FIGS. 4 through 6. The current sources of the first and the second optical memories 41 and 42 are, however, somewhat different in the manner which will shortly be described. Other elements of the first and the second optical memories 41 and 42, the elements of the bistable semiconductor lasers in particular, will be referred to by using the reference numerals used in FIG. 4.

The circuit comprises the bistable semiconductor lasers of the first and the second optical memories 41 and 42 optically in tandem. More specifically, the second end 22 of the active layer 19 of the laser of the first optical memory 41 is coupled optically directly to the first end 21 of the active layer 19 of the laser of the second optical memory 42. In marked contrast to the circuit illustrated with reference to FIG. 7, no intermediate optical isolator is necessary between the first and the second optical memories 41 and 42. This simplified the circuitry and facilitates implementation of the circuit as an integrated circuit.

The first and the second current sources of the first and the second optical memories 41 and 42 will be referred to afresh as first through fourth current sources and designated by 31 and 32 as before, 43, and 44. The injection currents supplied from the first through the fourth current sources 31, 32, 43, and 44 will anew be called first through fourth injection currents and denoted by I1 and I2 as above, I3, and I4. The injection currents I1 through I4 serve as clocks for the flip-flop circuit. The second and the fourth current sources 32 and 44 are for giving the bias value i(b) always to the second and the fourth injection currents I2 and I4 and are depicted as constant current sources. In other respects, each of the first and the second optical memories 41 and 42 is not different from the optical memory device depicted in FIG. 4.

Figure 10:
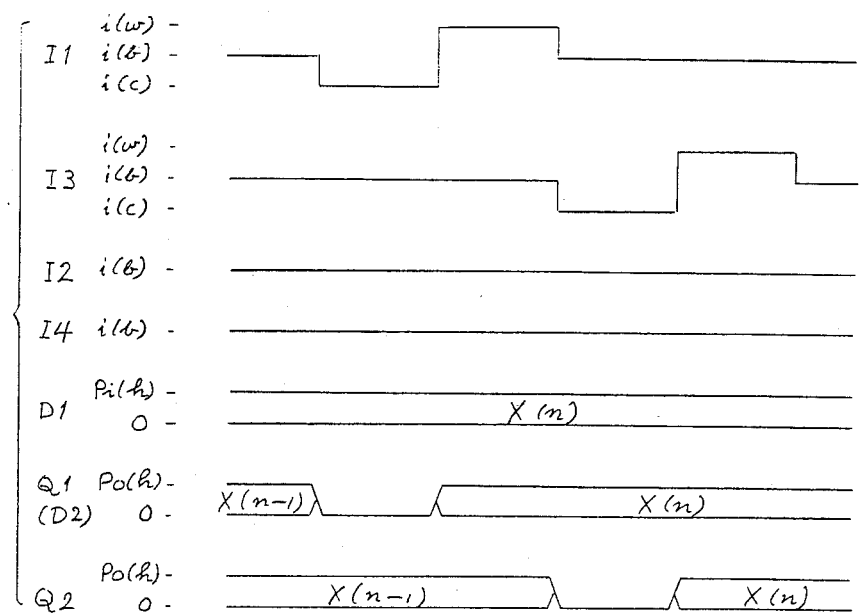
FIG. 10 is a schematic time chart for use in describing operation of the device illustrated in FIG. 9.

Turning to FIG. 10, the first and the third injection currents I1 and I3 will be varied in the manner exemplified along a first or top line and a second line from the top. The second and the fourth injection currents I2 and I4 are given the bias value i(b) as described above and depicted along third and fourth lines from the top. Like in FIG. 8, the first optical input signal D1 successively represents (n−1)-th and n-th optical information X(n−1) and X(n). During a time interval to which attention is directed in the figure, the first optical input signal D1 represents the n-th optical information as illustrated along a fifth line from the top. At the beginning of the time interval in question, it will be assumed that the first optical output signal Q1 or the second optical input signal D2 and the second optical output signal Q2 represent the (n−1)-th optical information in common in the manner depicted along a sixth or penultimate line and a seventh or bottom line.

More particularly referring to FIG. 10, it should be noted at first that the second optical output signal Q2 is never memorized in the first optical memory 41 because the second injection current I1 is always kept at the bias value i(b).

When the first injection current I1 is given the clear value i(c), the first optical output signal Q1 is given the low intensity of zero no matter whichever of the low intensity and the high intensity Po(h) is had by the (n−1)-th optical information X(n−1) which is so far kept in the first optical memory 41. When the write value i(w) is thereafter given to the first injection current I1, the first opticl input signal D1 is memorized in the first optical memory 41. The first optical output signal Q1 now represents the n-th optical information X(n).

When the third injection current I3 is given the clear value i(c), the second opical outputs ingal Q2 is given the low intensity of zero. When the write value i(w) is subsequently given to the third injection current I3, the second optical memory 42 is loaded with the second optical input signal D2, namely, the first optical output signal Q1.

In this manner, successive control of the first and the third injection currents I1 and I3 makes it possible to latch the first optical input signal D1 in the bistable semiconductor laser of the first optical memory 41 and to shift the optical information X(n) memorized in the first optical memory 41 to the second optical memory 42. Each of the first and the second optical memories 41 and 42 now memorizes the n-th optical information.

Figure 11:
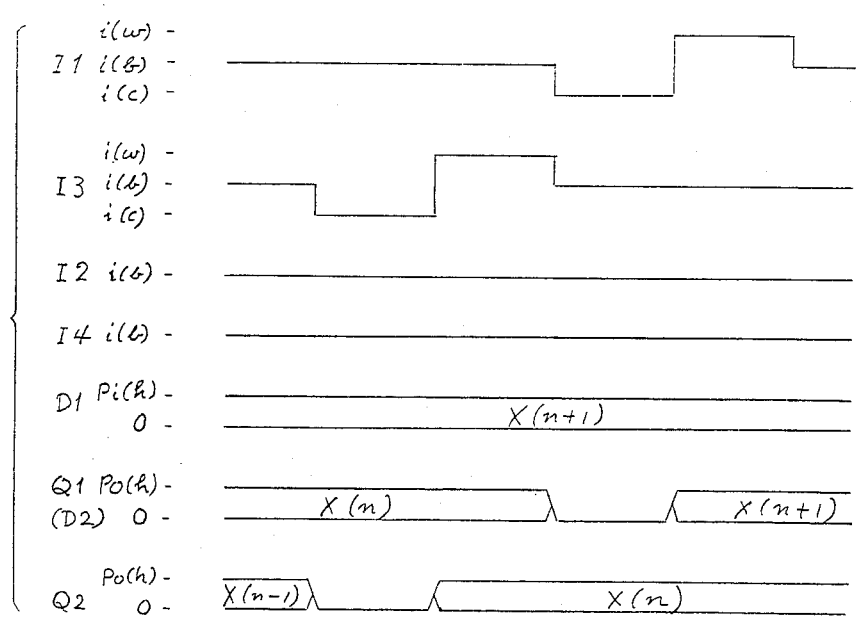
FIG. 11 is another schematic time chart for use in describing operation of the device shown in FIG. 9.

Further turning to FIG. 11, the first and the second optical memories 41 and 42 are operable like the optical memories 36 and 37 (FIG. 7). The first and the third injection currents I1 and I3 are exemplified along first and second lines. The second and the fourth injection currents I2 and I4 are always given the bias value i(b) in the manner depicted along third and fourth lines. During the time interval under consideration, the first optical input signal D1 represents the (n+1)-th optical information X(n+1) as depicted along a fifth line. In the manner described in conjunction with FIG. 8, with first optical output signal Q1 or the second optical input signal D2 and the second optical output signal Q2 vary as illustrated along sixth and seventh lines.

Figure 12:
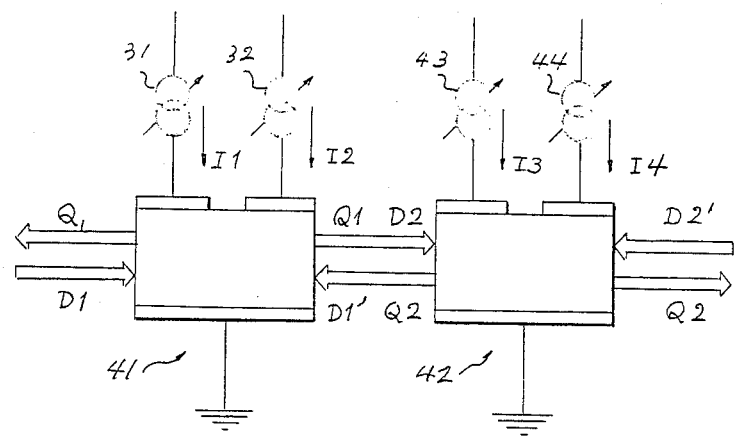
FIG. 12 is a schematic side view of an optical master-slave flip-flop device which comprises a pair of optical memory devices according to a third embodiment of this invention.

Referring to FIG. 12, the description will proceed to an optical master-slave flip-flop circuit or device which comprises again a pair of optical memories and is a third embodiment of this invention. The circuit comprises similar parts designated by like reference numerals. Elements of the bistable semiconductor laser of each of the first and the second optical memories 41 and 42 will be referred to by using the reference numerals used in FIG. 4. In contrast to the second and the fourth current sources 32 and 44 of the circuit illustrated with reference to FIG. 9, the second and the fourth current sources are adjustable. Although so different, the second and the fourth current sources will be designated by the reference numerals 32 and 44.

It should be noted in connection with the device depicted in FIG. 12 that the first and the second optical input signals D1 and D2 will now be called first and second optical rightwards input signals. The second optical output signal Q2 emitted from the first end 21 of the active layer 19 of the bistable semiconductor laser of the second optical memory 42, is delivered as a first optical leftwards input signal D1' to the second end 22 of the active layer 9 of the laser of the first optical memory 41. A second optical leftwards input signal D2' is supplied from outside of the circuit to the second end 22 of the active layer 19 of the laser of the second optical memory 42. The circuit is not only operable in response to the first optical rightwards input signal D1 in the manner described in conjunction with FIGS. 10 and 11 but also bidirectionally in response to the second optical leftwards input signal D2' as will be described in the following.

Figure 13:
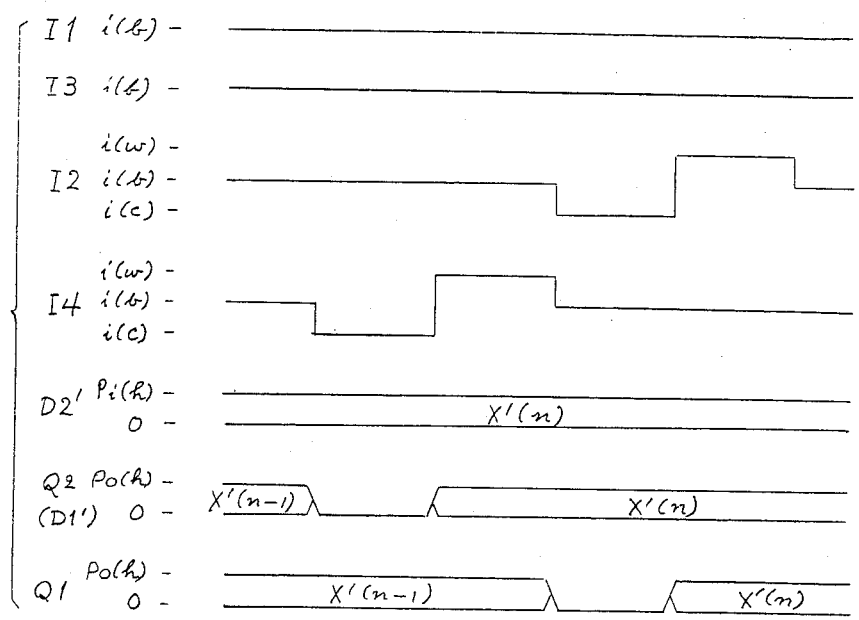
FIG. 13 is a schematic time chart for use in describing operation of the device depicted in FIG. 12.

Turning to FIG. 13, the first and the third current sources 31 and 43 (FIG. 12) are adjusted so as to give the bias value i(b) to the first and the third injection currents I1 and I3 in the manner depicted along a first or top line and a second line from the top. The second and the fourth injection currents I2 and I4 will be varied as exemplified along third and fourth lines from the top. Like in FIG. 10, the second optical leftwards input signal D2' successively represents (n−1)-th and n-th optical information X'(n−1) and X'(n). During a time interval to which attention is directed in the figure, the second optical leftwards input signal D2' represents the n-th optical information in the manner depicted along a fifth line from the top. At the beginning of the time interval under consideration, it will be assumed that the first and the second optical memories 41 and 42 keep the (n−1)-th optical information in common. The second optical output signal Q2 or the first optical leftwards input signal D1' represents the optical information X'(n−1) as depicted along a sixth or penultimate line. The first optical output signal Q1 represents also the optical information X'(n−1) as shown along a seventh or bottom line and is emitted to outside of the circuit as an ultimate optical output signal of the conduit.

More specifically referring to FIG. 13, it should be noted at first that the first and the second optical rightwards input signals D1 and D2 are never memorized in the first and the second optical memories 41 and 42. This is because the first and the third injection currents I1 and I3 are kept at the bias value i(b).

When the fourth injection current I4 is given the clear value i(c), the second optical output signal Q2 or the first optical leftwards input signal D1' is given the low intensity of zero no matter whichever of the low intensity and the high intensity Po(h) is had by the (n−1)-th optical information X'(n−1) which is thus far kept in the second optical memory 42. At this instant, the first optical leftwards input signal D1' is not memorised in the first optical memory 41 because the second injection current I2 has the bias value i(b). When the fourth injection current I4 is thereafter given the write value i(w), the second optical leftwards input signal D2' is written in the second optical memory 42.

When the second injection current I2 is given the clear value i(c), the first optical output signal Q1 is given the low intensity of zero. The second optical output signal Q2 or the first optical leftwards input signal D1' now represents the n-th optical information X'(n). When the second injection current I2 is subsequently given the write value i(w), the n-th optical information X'(n) is written in the first optical memory 41. The n-th optical information X'(n) is kept in the first and the second optical memories 41 and 42. In this manner, successive control of either the first and the third injection currents I1 and I3 or the second and the fourth injection currents I2 and I4 makes it possible to make the circuit successively memorize selected one of the first optical rightwards and the second optical leftwards input signals D1 and D2'.

Figure 14:
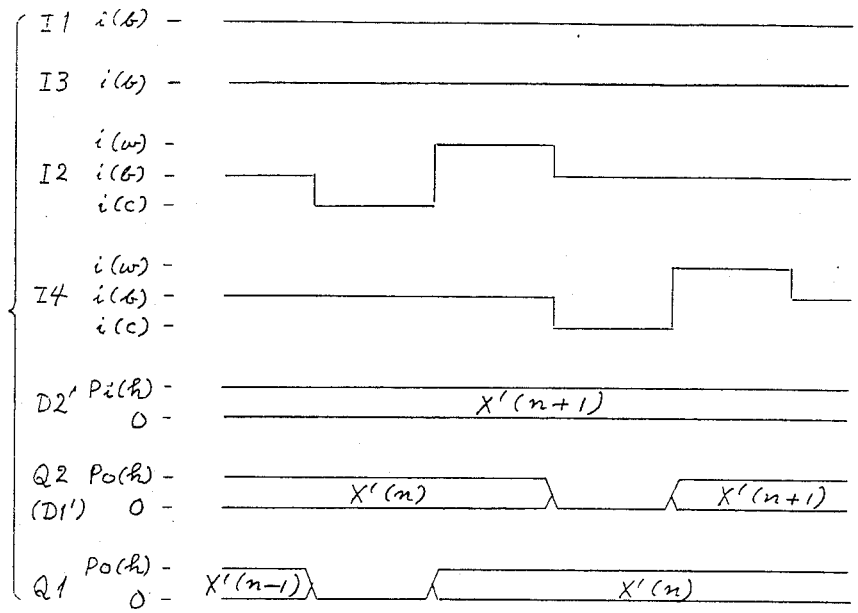
FIG. 14 is another schematic time chart for use in describing operation of the device shown in FIG. 12.

Further turning to FIG. 14, the first and the second optical memories 41 and 42 are not only operable in the manner described in connection with FIG. 13 but also as in FIG. 11 for the second optical leftwards input signal D2'. The first and the third injection currents I1 and I3 are given the bias value i(b) in common in the manner depicted along first and second lines. The second and the fourth injection currents I2 and I4 are varied as exemplified along third and fourth lines. The second optical leftwards input signal D2' successively represents (n−1)-th, n-th, and (n+1)-th optical information X'(n−1), X'(n), and X'(n+1). In a time interval under consideration, the second optical leftwards input signal D2' represents the (n+1)-th optical information as shown along a fifth line. In the manner described in conjunction with FIG. 13, the second optical output signal Q2 or the first optical leftwards input signal D1' varies as exemplified along a sixth line. The first optical output signal Q1 varies in the manner depicted along a seventh line.

Figure 15:
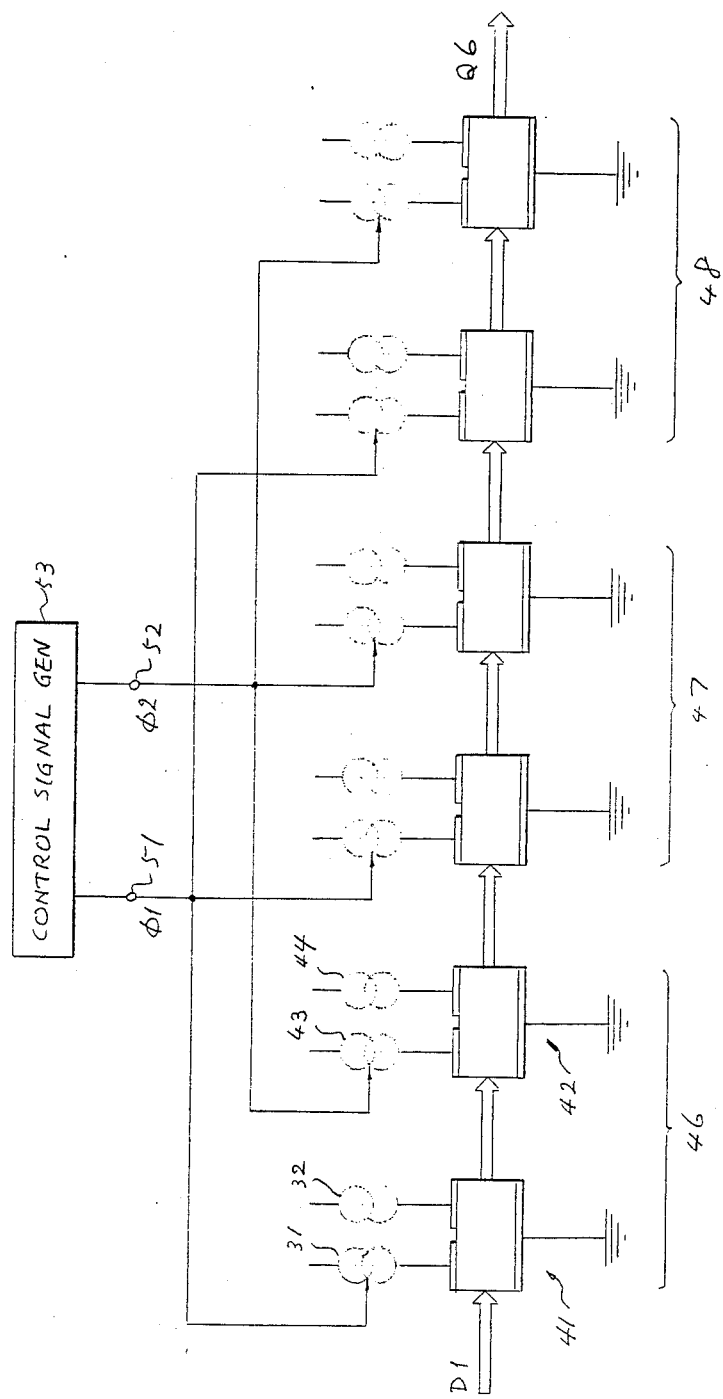
FIG. 15 schematically shows, partly in blocks, a side view of an optical signal shifting device which comprises a plurality of optical master-slave flip-flop devices according to a fourth embodiment of this invention.

Referring now to FIG. 15, the description will further proceed to an optical signal shifting device which comprises a plurality of the optical master-slave flip-flop circuits and is a fourth embodiment of this invention. In the example being illustrated, the device comprises first through third optical master-slave flip-flop circuits 46, 47, and 48. Elements of each optical master-slave flip-flop circuit will be referred to by using the reference numerals used in FIG. 9. Elements of each bistable semiconductor laser of the flip-flop circuits 46 through 48 will be referred to by using like reference numerals as in FIG. 4.

More particularly, the device includes first through N-th bistable semiconductor lasers optically in tandem where N represents an even positive integer which is not less than two. The (n−1)-th and the n-th bistable semiconductor lasers are arranged optically in tandem with the second end 22 of the active layer 19 of the (n−1)-th semiconductor laser optically directly coupled to the first end 21 of the active layer 19 of the n-th semiconductor laser where n represents each of 2 through N and has no concern with the number assigned to the optical information such as X(n) or X'(n).

It should be pointed out here in connection with the optical master-slave flip-flop circuit illustrated with reference to FIGS. 9 through 11 or FIGS. 12 through 14 that the first and the second current sources 31 and 32 are the first and the second currents ources 31 and 32 (FIG. 4) for an odd-numbered bistable semiconductor laser in FIG. 15. The third and the fourth current sources 43 and 44 are the first and the second current sources 31 and 32 (FIG. 4) for an even-numbered bistable semiconductor laser. At any rate, a first electrical terminal 51 is connected in FIG. 15 to the first current source 31 of each of the first through the third optical master-slave flip-flop circuits 46 to 48. A second electrical terminal 52 is connected to the third current source 43 of each optical master-slave flip-flop circuit. A control signal generator 53 is for supplying the first and the second electrical terminals 51 and 52 with first and second electrical control signals $\phi 1$ and $\phi 2$ which are variable as will readily be understood from the following.

For the optical signal shifting device being illustrated, the second and the fourth current sources 32 and 44 of each optical master-slave flip-flop circuit are constant current sources as in FIG. 9. When FIG. 10 is taken in consideration, it will readily be understood that the first electrical control signal $\phi 1$ can be used in controlling the first current source 31 of each optical master-slave flip-flop circuit so that the first optical memory 41 of the first optical master-slave flip-flop circuit 46 may memorize the optical information represented by the first optical input signal D1 while the optical information memorized in the second optical memories 42 of the first and the second optical master-slave flip-flop circuits 46 and 47 are shifted to the first optical memories 41 of the second and the third optical master-slave flip-flop circuits 47 and 48, respectively. The second electrical control signal $\phi 2$ can be used in controlling the third current source 43 of each optical master-slave flip-flop circuit so that the optical information memorized in the first optical memory 41 of each optical master-slave flip-flop circuit may be shifted to the second optical memory 42 of that optical master-slave flip-flop circuit. In this manner, the optical signal shifting device is operable to shift the optical information successively represented by the first optical input signal D1 eventually to the second optical memory 42 of the third optical master-slave flip-flop circuit 48. The optical information thus shifted to the last-mentioned second optical memory 42 is represented by an N-th optical output signal, namely, a sixth optical output signal Q6 in the illustrated example.

Figure 16:
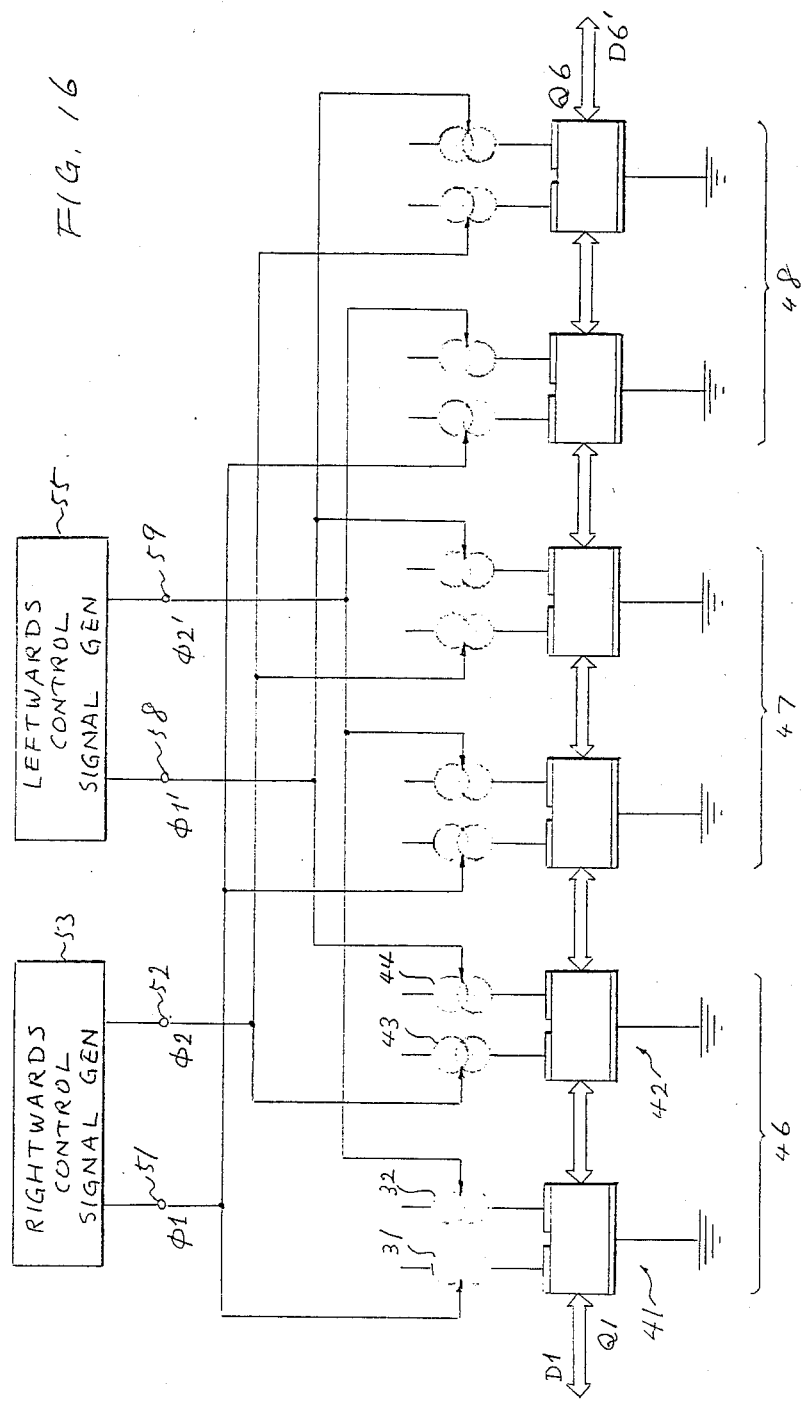
FIG. 16 schematically shows, partly in blocks, a side view of an optical signal shifting device which comprises a plurality of optical master-slave flip-flop device according to a fifth embodiment of this invention.

Turning to FIG. 16, an optical signal shifting device will be described which comprises similar parts designated by like reference numerals and is a fifth embodiment of this invention. The optical input signal supplied to the first optical memory 41 of the first optical master-slave flip-flop circuit 46, in the first optical rightwards input signal D1 of the type described in conjunction with FIG. 12. An N-th optical leftwards input signal (now D6') is supplied to the second optical memory 42 of the third optical master-slave flip-flop circuit 48.

The control signal generator 53 and the first and the second electrical control signals $\phi 1$ and $\phi 2$ will now be called a rightwards control signal generator and first and second rightwards control signals. In the manner described above, the first optical rightwards input signal D1 is shifted to the second optical memory 42 of the third optical master-slave flip-flop circuit 48 by the first and the second rightwards control signals $\phi 1$ and $\phi 2$ produced by the rightwards control signal generator 53.

The device of FIG. 16 comprises a leftwards control signal generator 55 for generating first and second leftwards control signals $\phi 1'$ and $\phi 2'$. The second and the fourth current sources 32 and 44 of each of the first through the third optical master-slave flip-flop circuits 46 to 48 are controlled by the second and the first leftwards control signals $\phi 2'$ and $\phi 1'$, respectively. Third and fourth electrical terminals 58 and 59 are supplied with the first and the second leftwards control signals $\phi 1'$ and $\phi 2'$ and are connected to the fourth and the second current sources 44 and 32 of each optical master-slave flip-flop circuit.

The device being illustrated, is capable of leftwards shifting optical signals like the device illustrated with reference to FIG. 12. It will readily be understood from FIG. 13 that the device shifts the optical information represented by the sixth optical leftwards input signal D6' to the first optical memory 41 of the first optical master-slave flip-flop circuit 46. In this manner, the last-mentioned first optical memory 41 produces an optical output signal which may be called a first optical output signal Q1 as in FIG. 12.

It is now understood that the optical signal shifting device of FIG. 16 has a bidirectional structure, namely, a forward and a backward structure which are identical to each other. For example, the first bistable semiconductor laser of the forward structure is the N-th bistable semiconductor laser of the backward structure. The second bi-stable semiconductor laser of the forward structure is the (N−1)-th bistable semiconductor laser of the backward structure. The forward and the backward structures are equivalent to each other.

Depending on the circumstances, it is possible to understand the first and the second rightwards control signals $\phi 1$ and $\phi 2$ as first and second predetermined electrical signals. The second and the first leftwards control signals $\phi 2'$ and $\phi 1'$ can be understood as third and fourth predetermined electrical signals. In this event, the terminals 59 and 58 may be referred to afresh as third and fourth electrical terminals. The rightwards control signal generator 53 can be understood as a first arrangement for supplying the first and the second predetermined electrical signals to the first and the second electrical terminals 51 and 52 and the leftwards control signal generator 55 as a second arrangement for suppling the third and the fourth predetermined electrical signals to the third and the fourth electrical terminals 59 and 58.

Figure 17:
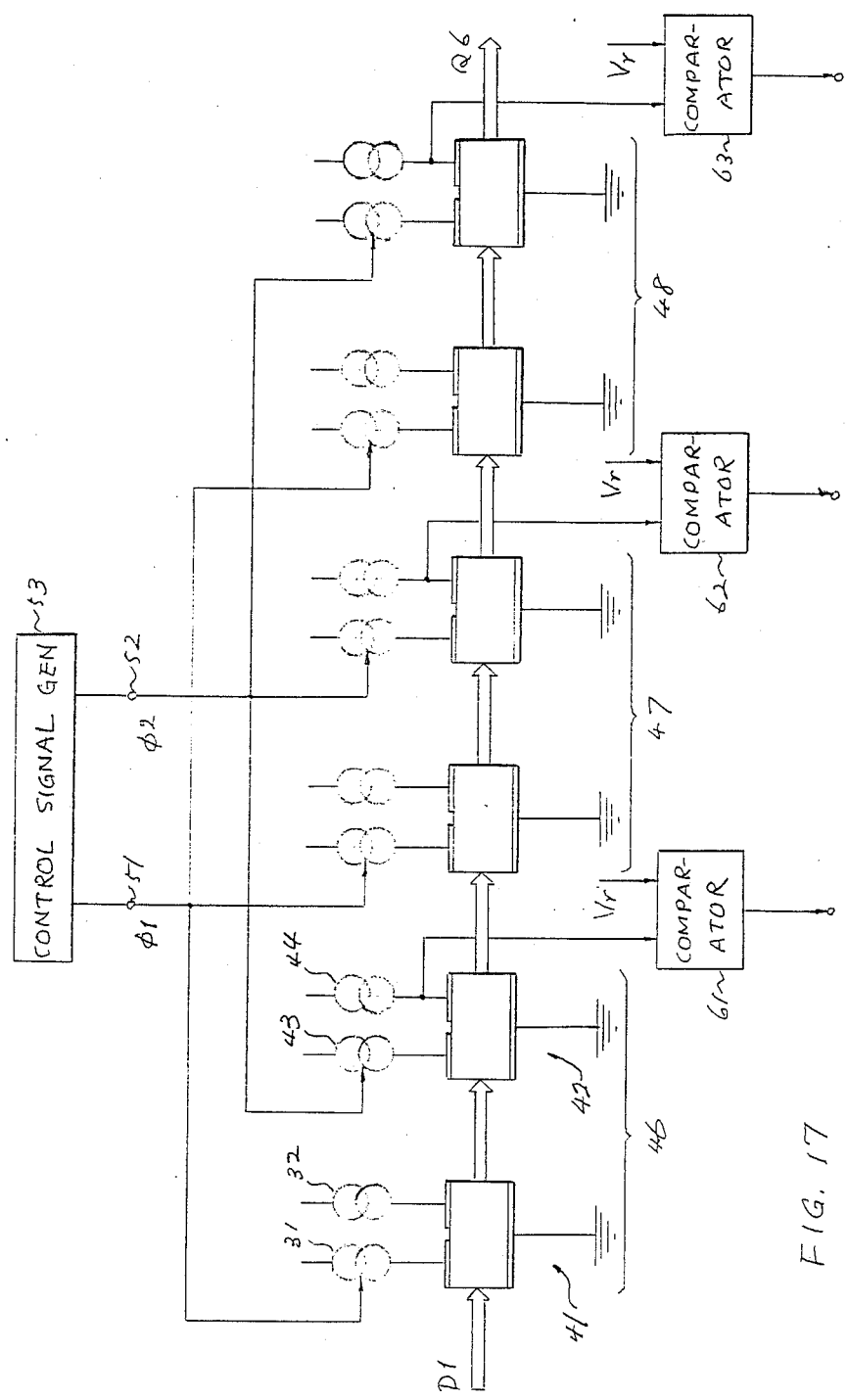
FIG. 17 schematically shows, partly in blocks, a side view of an optical signal shifting device which comprises a plurality of optical master-slave flip-flop devices according to a sixth embodiment of this invention.

Referring to FIG. 17, description will be given as regards an optical signal shifting device which comprises a plurality of optical master-slave flip-flop circuits and is a sixth embodiment of this invention. Similar parts are designated again by like reference numerals. The device is not only operable as in FIG. 15 but also as in FIG. 16. The second and the fourth current sources 32 and 44 of each optical master-slave flip-flop circuit will, however, be presumed to be constant current sourecs as in FIG. 15.

First through third voltage comparators 61, 62, and 63 are used in conjunction with the first through the third optical master-slave flip-flop circuits 46 to 48, respectively. More particularly, each of the voltage comparators 61 through 63 has first and second input terminals and an output terminal. The first input terminal is connected to the second electrode of each second optical memory 42. The second input terminals of the first through the third voltage comparators 61 to 63 are supplied with a reference voltage Vr of a predetermined voltage in common.

Figure 18:
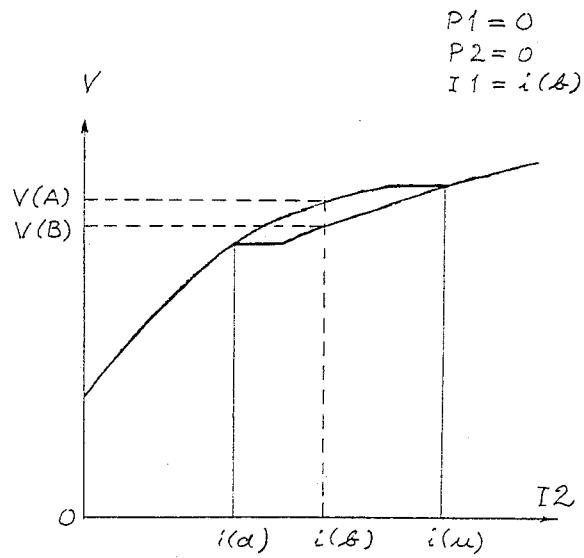
FIG. 18 drawn below FIG. 14 merely for convenience of illustration, shows another bistability of the laser used in each optical master-slave flip-flop device of the device depicted in FIG. 17.

Turning to FIG. 18 for a short while, it will be assumed in FIG. 4 that each of the first and the second optical input signals P1 and P2 has the low level of zero and that the first injection current I1 is kept at the bias value i(b). The second electrode 27 has a voltage V which varies with hysteresis versus the second injection current I2. More specifically, the voltage V grows generally high when the second injection current I2 is increased. The voltage V is, however, kept substantially constant when the second injection current I2 is increased near to the upper threshold value i(u). The voltage V again rises when the second injection current I2 is further increased.

In FIG. 18, the voltage V becomes generally low when the second injection current I2 is decreased. During the decrease, the voltage V is kept substantially constant when the second injection current I2 is decreased near to the lower threshold value i(d) until the second injection current I2 is further reduced below the lower threshold value i(d). It is therefore appreciated that the voltage V has higher and lower voltages V(A) and V(B) when the bias value i(b) is given to the second injection current I2 and when the bistable semiconductor laser is in the low and the high stable states A and B, respectively.

Turning back to FIG. 17, it will be assumed that the first electrical control signal $\phi 1$ is given a value that makes the first current source 31 of each optical master-slave flip-flop circuit produce the first injection current I1 of the bias value i(b). This makes the second optical memory 42 of each optical master-slave flip-flop circuit receive optical input signals of the low level of zero from the first optical memory 41 of that optical master-slave flip-flop circuit and also from the first optical memory 41 of the optical master-slave flip-flop circuit that next follows the flip-flop circuit in question.

Under the circumstances, comparison of FIGS. 17 or 9 with FIG. 4 will show that it is possible by supplying the fourth injection current I4 of the bias value i(b) to the second electrodes 27 of the second optical memory 42 and by detecting the voltage of the second electrode 27 to know whether the bistable semiconductor laser is in the low stable state A or in the high stable state B, namely, whether the optical information kept in the second optical memory 42 makes the laser generate the optical output signal of the low intensity of zero or the high intensity Po(h). The reference voltage Vr is selected between the higher and the lower voltages V(A) and V(B) which are described in conjunction with FIG. 18. It is possible with this to make the optical signal shifting device produce in parallel the optical information which is shifted either rightwards or leftwards to the second optical memory 42 of the respecteve optical master-slave flip-flop circuits 46 through 48 and is concurrently kept therein.

Reviewing FIG. 18, it will now be assumed in FIG. 4 that each of the first and the second optical input signals P1 and P2 has the low level of zero and that the second injection current I1 is kept at the bias value i(b). The first electrode 26 has a voltage which varies like the voltage V described as regards the second electrode 27. Higher and lower voltages appear at the first electrode 26 when the first injection current I1 is also given the bias value i(b) and when the bistable semiconductor laser is in the high and the low stable states A and B, respectively.

Referring again to FIGS. 17 and 18, the optical signal shifting device can produce in parallel the optical information which is shifted either rightwards or leftwards to the first optical memory 41 of each optical master-slave flip-flop circuit and is simultaneously kept therein. It should be understood in view of the above-described bidirectional structure that such an optical sginal shifting device is an equivalent of the optical signal shifting device illustrated with reference to FIGS. 17 and 18.

Figure 19:
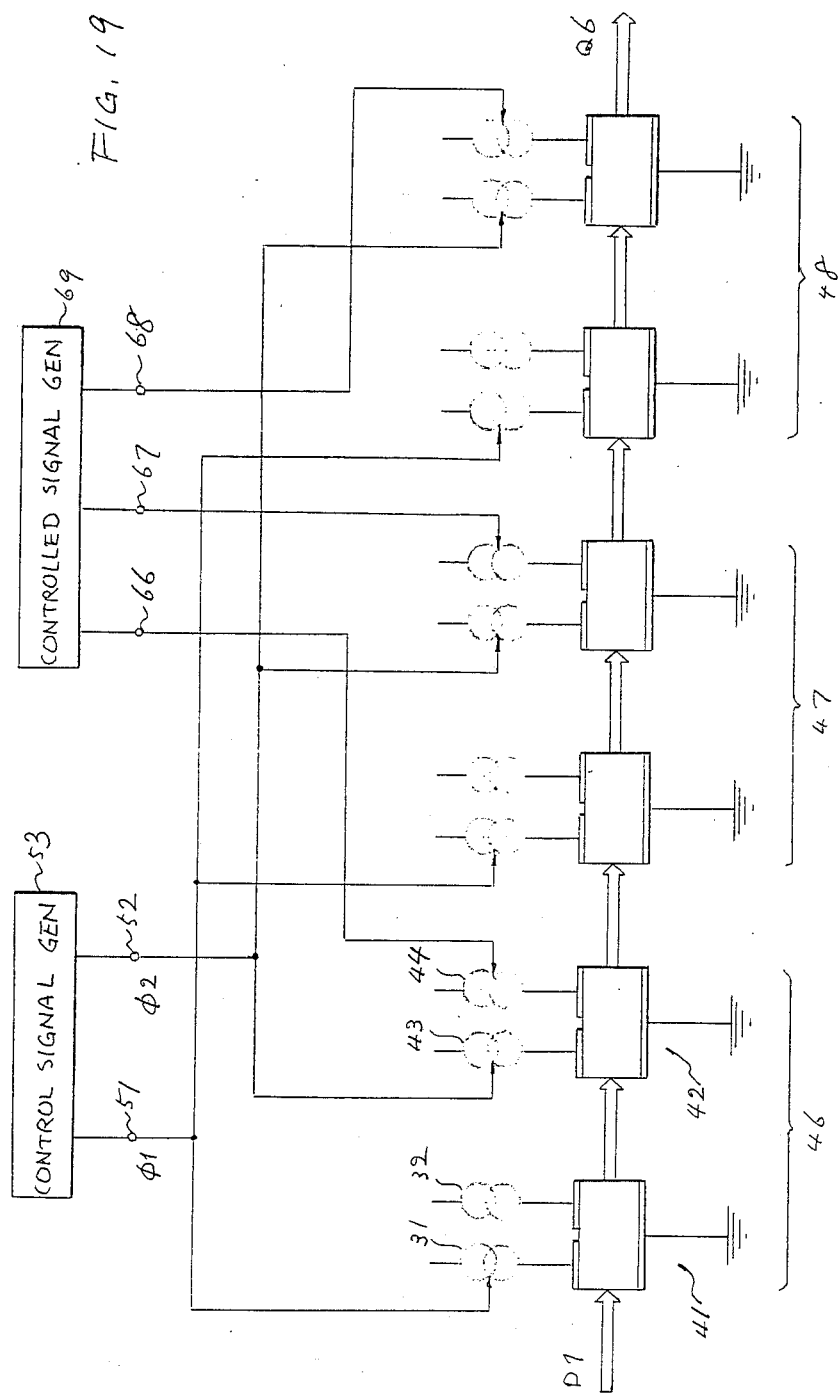
FIG. 19 schematically shows, partly in blocks, a side view of an optical signal shifting device which comprises a plurality of optical master-slave flip-flop devices according to a seventh embodiment of this invention.

Referring now to FIG. 19, the description will finally proceed to an optical signal shifting device which comprises again a plurality of optical master-slave flip-flop circuits of FIGS. 9 or 12 and is a seventh embodiment of this invention. Similar parts are designated once again by like reference numerals. The second and the fourth current sources 32 and 44 of each optical master-slave flip-flop circuit should be adjustable current sources even when the device is used in only rightwards shifting the first optical input signal D1.

First through third electrical terminals 66, 67, and 68 are connected to the fourth current sources 44 of the respective optical master-slave flip-flop circuits 46 through 48. A controlled signal generator 69 is for supplying first through third controlled electrical signals to the respective terminals 66 through 68.

It will be assumed that the first electrical control signal $\phi 1$ is given a value that makes the first current source 31 of each optical master-slave flip-flop circuit produce the first injection current I1 of the bias value i(b). In this event, the second optical memory 42 of each optical master-slave flip-flop circuit is given optical input signals of the low level of zero from adjacent optical memories. The bistable semiconductor laser of each second optical memory 42 therefore has the optical input versus second injection current characteristic which is similar to the characteristic described in connection with FIG. 5 (A).

When the first through the third control electrical signals are given a common value that gives the clear value i(c) to the fourth injection current I4 of each optical master-slave flip-flop circuit, an optical signal of the low level or intensity of zero is simultaneously forcibly memorized in the second optical memories 42 of the respective optical master-slave flip-flop circuits 46 through 48. When the controlled electrical signals are suplied to the first through the third electrical terminals 66 to 68 with another common value that makes the fourth injection current I4 of each optical master-slave flip-flop circuit have, for example, the write value i(w), an optical signal of the high intensity Po(h) is forcibly memorized in common in the second optical memories 42 of the respective optical master-slave flip-flop circuits 46 to 48.

It is possible in this manner to forcibly set optical information of the logic zero and/or one value in the second optical memeroies 42 of the respective optical master-slave flip-flop circuits 46 through 48 in parallel.

Such optical information may likewise be forcibly set in the first optical memories 41 of the respective optical master-slave flip-flop circuits 46 to 48 in parallel. An optical signal shifting device capable of forcibly setting the logic zero and/or one optical information in the first optical memories 41 in parallel, is an equivalent of the optical signal shifting device illustrated with reference to FIG. 19.

While this invention has thus far been described in specific conjunction with an appreciable number of embodiments thereof, it will now be readily possible for one skilled in the art to carry this invention into effect in various other manners. Above all, it should be clearly understood that the optical memory device, the optical master-slave flip-flop device, and the optical signal shifting device are readily implemented as an integrated circuit. The side views so far described should therefore be understood as illustrative of such a device as discrete devices merely for convenience of description.

What is claimed is:

1. An optical device including a bistable semiconductor laser, said bistable semiconductor laser comprising an active layer (19), first and second separate electrodes (26, 27) each parallel to said active layer, said active layer having first and second ends (21, 22) adjacent to said first and said second electrodes, respectively, first and second adjustable current sources (31, 32) for supplying first and second injection currents (I1, I2) to said active layer through said first and said second electrodes, respectively, and adjusting means for adjusting said first and said second injection currents to make said laser selectively memorize one of first and second optical signals (P1, P2) supplied to said first and said second ends, respectively.

2. An optical master-slave flip-flop device including first and second bistable semiconductor lasers optically in tandem, each comprising an active layer and first and second electrodes separately parallel to said active layer, wherein the improvement comprises first and second current sources for supplying first and second injection currents to the active layer of each of said first and said second bistable semiconductor lasers through the first and the second electrodes thereof, respectively at least one of said current sources being adjustable and adjusting means for adjusting the injection current of said at least one of said current sources which is adjustable.

3. An optical master-slave flip-flop device as claimed in claim 2, the active layer of each of said first and said second bistable semiconductor lasers having the first and second ends adjacent to the first and the second electrodes thereof, respectively, wherein said first and said second bistable semiconductor lasers are arranged optically in tandem with the second end of the active layer of said first bistable semiconductor laser coupled optically directly to the first end of the active layer of said second bistable semiconductor laser.

4. An optical master-slave flip-flop device as claimed in claim 3, wherein the first current source for each of said first and said second bistable semiconductor lasers is adjustable, the second current source being for suppling the second injection current of a predetermined value to the active layer of each of said first and said second bistable semiconductor lasers.

5. An optical master-slave flip-flop device as claimed in claim 4, wherein the first end of the active layer of said first bistable semiconductor laser is for receiving an optical input signal, the second end of the active layer of said second bistable semiconductor laser being for emitting an optical output signal dependent on said optical input signal.

6. An optical master-slave flip-flop device as claimed in claim 3, wherein the first and the second current sources for each of said first and said second bistable semiconductor lasers are adjustable.

7. An optical master-slave flip-flop device as claimed in claim 6, wherein the first end of the active layer of said first bistable semiconductor laser and the second end of the active layer of said second bistable semiconductor laser are for receiving first and second optical input signals, respectively, the second end of the active layer of said second bistable semiconductor laser emitting a first optical output signal when the first end of the active layer of said first bistable semiconductor laser receives said first optical input signal, the first end of the active layer of said first bistable semiconductor laser emitting a second optical output signal when the second end of the active layer of said second bistable semiconductor laser receives said second optical input signal.

8. An optical signal shifting device including first through N-th bistable semiconductor lasers optically in tanden where N represents an even positive integer which is not less than two, each bistable semiconductor laser comprising an active layer and first and second electrodes separately parallel to said active layer, said active layer having first and second ends adjacent to said first and said second electrodes, respectively, the (n−1)-th and the n-th bistable semiconductor lasers being arranged optically in tandem with the second end of the active layer of said (n−1)-th bistable semiconductor laser coupled optically directly to the first end of the active layer of said n-th bistable semiconductor laser where n represents each of 2 through N, wherein the improvement comprises first and second current sources for suppling first and second injection currents to the active layer of each of said first through said N-th bistable semiconductor lasers through the first and the second electrodes thereof, respectively, at least one of said first and second current sources being adjustable, adjusting means for adjusting the injection current of said at least one of said first and second current sources which is adjustable, a first electrical terminal connected to the first current sources for the odd-numbered bistable semiconductor lasers, and a second electrical terminal connected to the first current sources for the even-numbered bistable semiconductor lasers.

9. An optical signal shifting device as claimed in claim 8, further comprising means for supplying first and second synchronized electrical signals to said first and said second electrical terminals to shift an optical signal memorized in said first bistable semiconductor laser to said N-th bistable semiconductor laser.

10. An optical signal shifting device as claimed in claim 8, further comprising a third electrical terminal connected to the second current sources for the odd-numbered bistable semiconductor lasers and a fourth electrical terminal connected to the second current sources for the even-numbered bistable semiconductor lasers.

11. An optical signal shifting device as claimed in claim 10, further comprising:

first means for supplying first and second predetermined electrical signals to said first and said second electrical terminals, respectively, said first and said second predetermined electrical signals being for shifting a first optical signal memorized in said first bistable semiconductor laser to said N-th bistable semiconductor laser; and second means for supplying third and fourth predetermined electrical signals to said third and said fourth electrical terminals, respectively, said third and said fourth predetermined electrical signals being for shifting a second optical optical signal memorized in said N-th bistable semiconductor laser to said first bistable semiconductor laser.

12. An optical signal shifting device as claimed in claim 8, further comprising a voltage comparator connected to the second electrode of each of the even-numbered bistable semiconductor lasers for comparing a voltage developed at the second electrode thereof with a predetermined voltage.

13. An optical signal shifting device as claimed in claim 8, further comprising:

parallel electrical terminals connected to the respective second current sources of the even-numbered bistable semiconductor lasers; and means for supplying controlled electrical signals to said parallel electrical terminals, respectively, to set preselected optical information in the respective even-numbered bistable semiconductor lasers.

* * * * *

UNITED STATES PATENT AND TRADEMARK OFFICE
CERTIFICATE OF CORRECTION

PATENT NO. : 4,748,630
DATED : May 31, 1988
INVENTOR(S) : NAGASHIMA

It is certified that error appears in the above-identified patent and that said Letters Patent is hereby corrected as shown below:

| | |
|---|---|
| COLUMN 1, LINE 30 | Delete "Komtsu" and insert --Komatsu--; |
| COLUMN 2, LINE 30 | After "tandem" delete "." and insert a comma --,--; |
| COLUMN 3, LINE 46 | After "Fig. 18" insert --,--; |
| COLUMN 3, LINE 68 | Delete "Long" and insert --Lang--; |
| COLUMN 4, LINE 2 | Delete "strip" insert --stripe--; |
| COLUMN 5, LINE 9 | Delete "function" and insert --fraction--; |
| COLUMN 6, LINE 60 | After "above" delete "the" and insert --with--; |
| COLUMN 7, LINE 16 | Delete "i(2)" and insert --i(w)-- |
| COLUMN 8, LINE 23 | Delete "input" and insert --output-- |
| COLUMN 9, LINE 39 | Delete "injectio" and insert --injection--; |
| COLUMN 11, LINE 18 | Delete "ingal" and insert --signal-- |
| COLUMN 11, LINE 68 | Delete "9" and insert --19--; |
| COLUMN 12, LINE 33 | Delete "conduit" insert --circuit--; |
| COLUMN 13, LINE 48 | Delete "ources" insert --sources--; |

UNITED STATES PATENT AND TRADEMARK OFFICE
CERTIFICATE OF CORRECTION

PATENT NO. : 4,748,630

DATED : May 31, 1988

INVENTOR(S) : NAGASHIMA

It is certified that error appears in the above-identified patent and that said Letters Patent is hereby corrected as shown below:

COLUMN 16, LINE 32   Delete "respecteve" insert --respective--;

COLUMN 16, LINE 38   Delete "I1" and insert --I2--;

COLUMN 16, LINE 52   Delete "sginal" and insert --signal--;

COLUMN 17, LINE 55   After "optical" insert --memory--;

COLUMN 20, LINE 12   Delete first instance of "optical";

Signed and Sealed this

Fifteenth Day of November, 1988

Attest:

*Attesting Officer*

DONALD J. QUIGG

*Commissioner of Patents and Trademarks*